US006903454B2

(12) United States Patent
Goldbach et al.

(10) Patent No.: US 6,903,454 B2
(45) Date of Patent: Jun. 7, 2005

(54) CONTACT SPRING CONFIGURATION FOR CONTACTING A SEMICONDUCTOR WAFER AND METHOD FOR PRODUCING A CONTACT SPRING CONFIGURATION

(75) Inventors: Matthias Goldbach, Dresden (DE); Albert Birner, Dresden (DE); Martin Franosch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/324,874

(22) Filed: Dec. 20, 2002

(65) Prior Publication Data

US 2003/0117158 A1 Jun. 26, 2003

(30) Foreign Application Priority Data

Dec. 20, 2001  (DE) ........................................ 101 62 983

(51) Int. Cl.[7] .............................................. H01L 23/48
(52) U.S. Cl. ........................ 257/688; 257/727; 324/757
(58) Field of Search .............................. 257/727, 688, 257/735, 736; 430/320; 324/754, 757

(56) References Cited

U.S. PATENT DOCUMENTS

| | | | | |
|---|---|---|---|---|
| 4,783,237 | A | * | 11/1988 | Aine et al. ..................... 438/52 |
| 5,152,695 | A | * | 10/1992 | Grabbe et al. ................. 439/71 |
| 5,869,974 | A | | 2/1999 | Akram et al. |
| 5,914,218 | A | | 6/1999 | Smith et al. |
| 5,973,394 | A | | 10/1999 | Slocum et al. |
| 6,051,866 | A | * | 4/2000 | Shaw et al. ................... 257/417 |
| 6,110,823 | A | | 8/2000 | Eldridge et al. |
| 6,255,126 | B1 | * | 7/2001 | Mathieu et al. ................ 438/15 |

FOREIGN PATENT DOCUMENTS

| | | |
|---|---|---|
| WO | WO 97/21105 | 6/1997 |
| WO | WO 01/09623 | 2/2001 |

OTHER PUBLICATIONS

Park, J.–Y. et al.: "Fabrication of Cantilever–Bump Type Si Probe Card", The Japan Society of Applied Physics, Jpn. J. Appl. Phys. vol. 39, Part 1, No. 12B, Dec. 2000, pp. 7108–7110.

Zhang, Y. et al.: "Thermally Actuated Microprobes for a New Wafer Probe Card", IEEE Journal of Microelectromechanical Systems, vol. 8, No. 1, Mar. 1999, pp. 43–49.

Orpana, M. et al.: "Control of Residual Stress of Polysilicon Thin Films by Heavy Doping in Surface Micromachining", IEEE, 1991, pp. 957–960.

Biebl, M. et al.: "In Situ Phosphorus–Doped Polysilicon for Integrated Mems", Transducers, Eurosensors IX, The $8_{th}$ International Conference on Solid–State Sensors and Actuators, and Eurosensors IX Stockholm, Sweden, Jun. 25–29, 1995, pp. 198–201.

Scheiter, T. et al.: "Rapid Thermal Annealing of Intrinsic Stress in Doped Silicon Films", Sensors and Materials, Tokyo, Ed. 8, No. 7, 1996, pp. 445–454.

* cited by examiner

*Primary Examiner*—Nathan J. Flynn
*Assistant Examiner*—Leonardo Andújar
(74) *Attorney, Agent, or Firm*—Laurence A. Greenberg; Werner H. Stemer; Ralph E. Locher

(57) ABSTRACT

A contact spring configuration for contacting semiconductor wafers is provided. At least one strip-type contact spring is provided on a substrate. The contact spring is fixed to a surface of the substrate on one side and is composed of a semiconductor material having a stress gradient which causes a permanent bending of the contact spring. The stress gradient in the semiconductor material is brought about by two semiconductor layers which are connected to one another and are mechanically strained differently. The different strains can be set by different doping or by deposition temperatures of different magnitude during the deposition of the semiconductor layers. The contact springs provide a good ohmic contact in particular with contact regions of a semiconductor wafer that are composed of a semiconductor material.

46 Claims, 6 Drawing Sheets

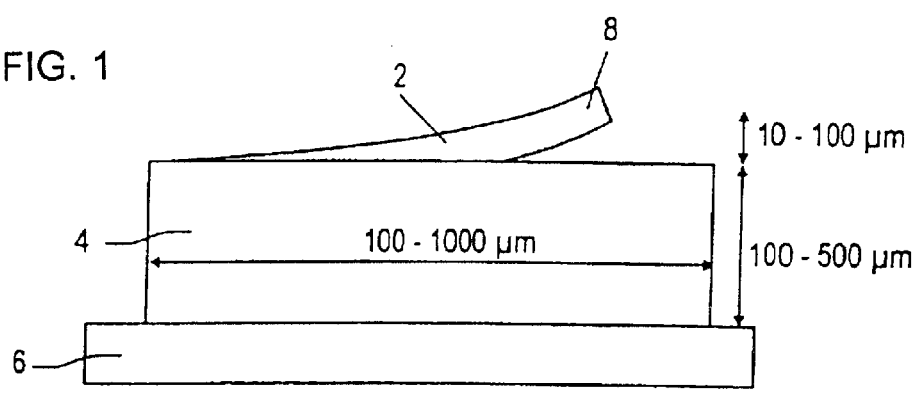
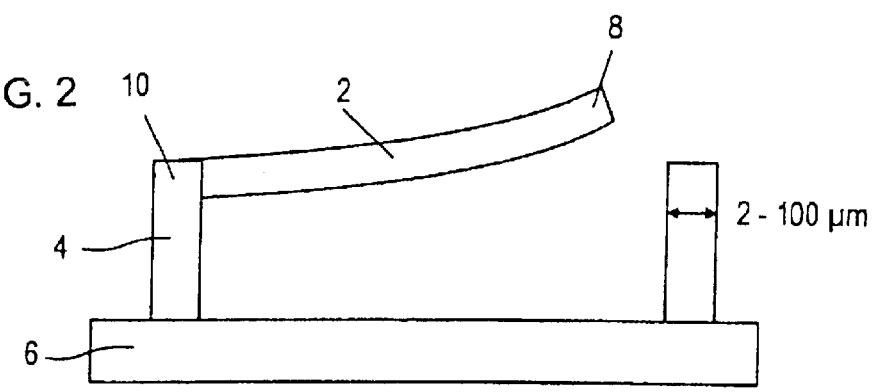
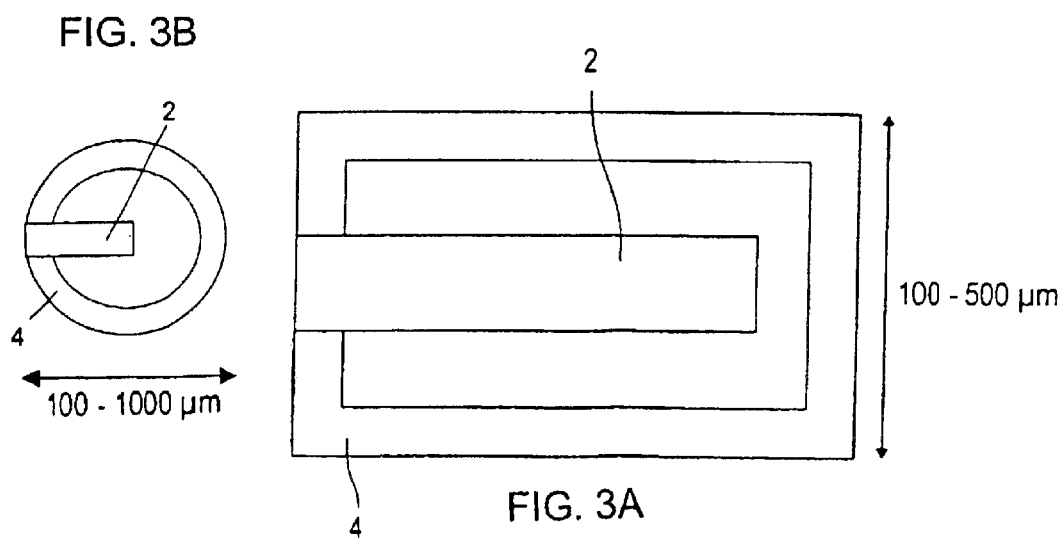

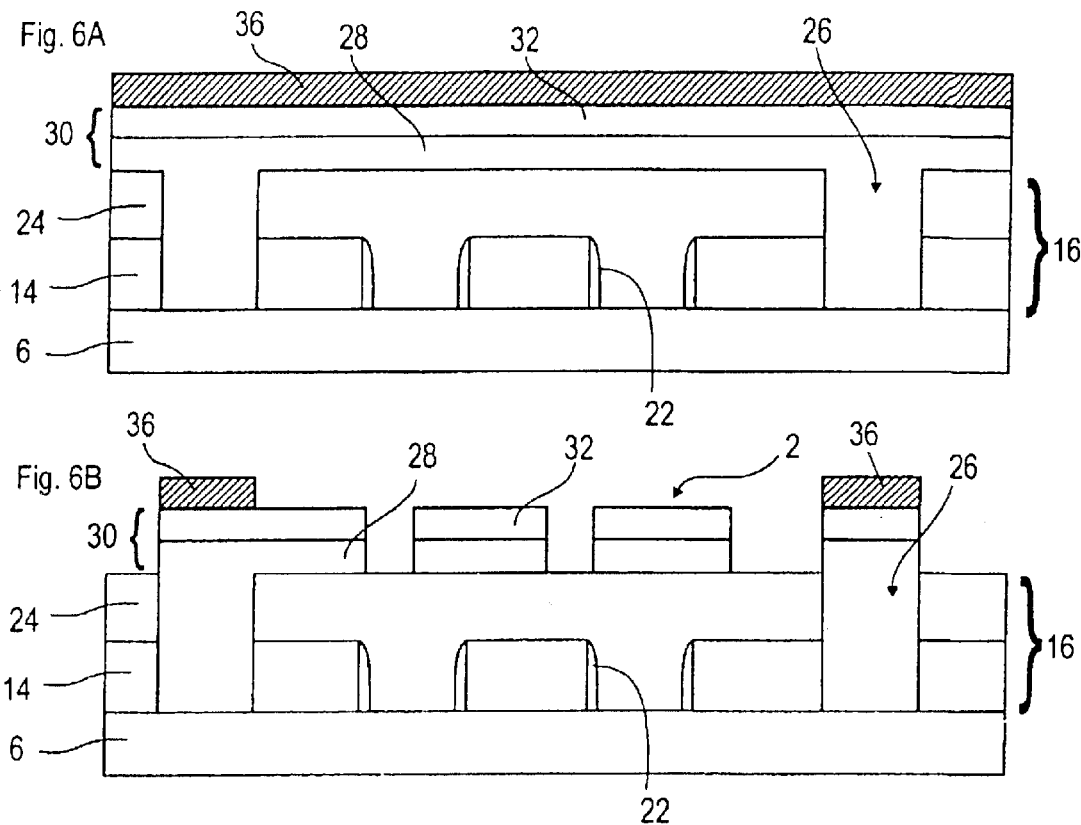
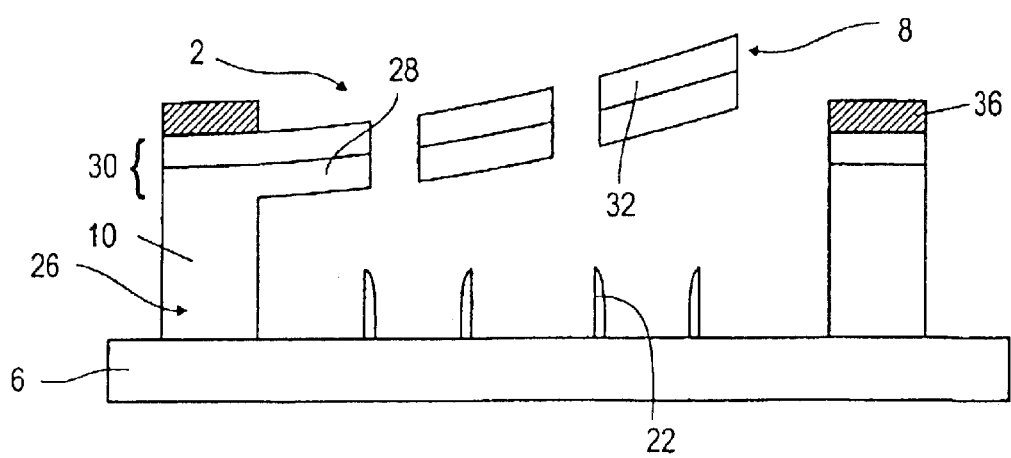

CONTACT SPRING CONFIGURATION FOR CONTACTING A SEMICONDUCTOR WAFER AND METHOD FOR PRODUCING A CONTACT SPRING CONFIGURATION

BACKGROUND OF THE INVENTION

Field of the Invention

The invention lies in the field of micromechanics and relates to a contact spring configuration for the contact connection of a semiconductor wafer with a substrate and at least one strip-type contact spring fixed to a surface of the substrate on one side.

For the contact connection of processed semiconductor wafers for test purposes during their production, use is made of contact spring configurations in which a semiconductor wafer is contact-connected via a plurality of individual contacts pressed against the semiconductor wafer.

Such a contact spring configuration, also called probe card, is described e.g. Fin U.S. Pat. No. 5,869,974. On a monocrystalline silicon membrane formed in flexible fashion, a plurality of contact needles is arranged in a contact pattern which corresponds to a pattern of corresponding contact regions on the semiconductor wafer to be contact-connected. In order to reduce the electrical resistance, the contact needles are coated with a metal layer. The silicon membrane bounds a cavity which can be filled through the use of a fluid in order to exert a pressure on the membrane. The membrane, which is thus made to bulge out in the direction of the semiconductor wafer to be contact-connected, presses the contact needles more strongly against the contact regions. At the same time, the intention is to compensate for a height difference that may be present between individual contact regions of the semiconductor wafer. However, this is only possible to a limited degree. In particular, relatively large height differences between directly adjacent contact regions cannot be adequately compensated for by the membrane clamped in on all sides. Thus, a sufficient contact connection of all the contact regions is not assured. Furthermore, owing to the metal layer, this contact spring configuration exhibits only limited front-end suitability, since metal can lead to contamination of semiconductor material.

A contact spring configuration for the temporary contact connection of integrated circuits provided with metallic contact regions is described in U.S. Pat. No. 5,914,218. The contact spring configuration, likewise referred to as probe card, includes a plurality of contact springs which are formed as bimetallic strips and which bend away from the surface of the carrier substrate on account of a mechanical strain between the two metal strips. On account of the material used for the contact springs this configuration makes it possible only to contact-connect semiconductor wafers with integrated circuits whose production has already been completed and which are provided with metallic contact regions, so-called pads. The semiconductor wafers provided with pads are already in the production phase referred to as back end, in which the processed semiconductor wafers are cut, encapsulated and provided with connections. By contrast, the steps required for producing the actual integrated circuit (formation of the active and passive components in and on the semiconductor substrate and formation of the wiring—also called metallization) come within the so-called front-end production phase. In particular after the formation of the active and passive components, testing of the integrated circuit is desirable in order to exclude semiconductor wafers that have been produced defectively from further production as early as possible. Furthermore, process parameters could be optimized and adapted as early as during the production of the integrated circuit if a test possibility were available. In this case, metallic contact springs are not suitable for the contact connection of semiconductor wafers which have not yet been processed to completion and in which doping regions and the like serve as contact regions. In particular, metal atoms that have diffused into the semiconductor substrate can bring about undesirable imperfections which lead to uncontrollable changed electrical properties.

SUMMARY OF THE INVENTION

It is accordingly an object of the invention to provide a contact spring configuration and a method of producing a contact spring configuration which overcome the above-mentioned disadvantages of the heretofore-known configurations and methods of this general type and which provide a reliable contact connection of a semiconductor wafer and which provide a contact connection exhibiting front-end suitability in conjunction with adequate compensation of height differences.

With the foregoing and other objects in view there is provided, in accordance with the invention, a contact spring configuration, including:
- a substrate having a surface;
- a strip-shaped contact spring having an end region fixed at the surface of the substrate; and
- the contact spring including a semiconductor material having a stress gradient causing an elastic bending of the contact spring.

In other words, there is provided, in accordance with the invention, a contact spring configuration for the contact connection of a semiconductor wafer with a substrate and at least one strip-type contact spring fixed to a surface of the substrate on one side, wherein the at least one contact spring is composed of a semiconductor material which has a stress gradient and which causes an elastic bending of the contact spring.

The use of semiconductor material for the contact springs makes it possible to use the contact spring configuration according to the invention for the contact connection of semiconductor wafers in the front-end production phase, since only the semiconductor material of the spring contacts makes direct contact with the semiconductor substrate of the semiconductor wafer to be contact-connected. Undesirable metal-semiconductor contacts are not formed.

A further advantage is to be seen in the fact that the contact spring configuration can be produced using devices which are also available as standard for the processing of semiconductor wafers. This makes it possible at the same time to produce contact springs adapted to the size of the contact regions. During the contact connection of semiconductor wafers during the front-end production phase, it is necessary to produce electrical connections to in some instances very small contact regions. Such contact regions may be e.g. doping regions. In order to be able to contact-connect such small contact regions, the corresponding contacts must likewise be very small. On account of the semiconductor material used for the contact spring, this can be produced in an order of magnitude corresponding to the contact region using the patterning devices and methods available in standard semiconductor technology.

Furthermore, a semiconductor material also has the advantage that it has a high elasticity in conjunction with low fatigue. Thus, e.g. silicon has a modulus of elasticity of about 165 GPa compared with steel with about 200 GPa, but, on the other hand, has a significantly lower fatigue than steel.

The contact spring may be composed either of monocrystalline or of polycrystalline semiconductor material. Polycrystalline material furthermore has the advantage that it can be applied to different materials by a plurality of deposition methods and, in the process, assumes virtually any desired form of the support. This results in great freedom of configuration with regard to the shaping of the contact spring. Therefore, the contact spring should preferably be composed exclusively of semiconductor material.

The spring properties of the contact spring are furthermore influenced by mechanical strains or stress gradients within the contact spring. This also applies to the degree of bending which is established without the action of external forces solely on account of the stress gradient built up intrinsically within the semiconductor material. The stress gradient can be brought about by various measures and be set in wide ranges; it is preferably chosen such that it leads to a bending of the contact spring from the plane of the substrate surface. One possibility is the two- or even multilayered formation of the contact spring. In this case, at least two semiconductor layers each having a different mechanical strain are connected to one another. The strain may involve tensile and/or compressive stress. The different strain is set e.g. during the production of the individual semiconductor layers. On account of the different strain of the two semiconductor layers, a stress gradient forms within the semiconductor material formed by the two semiconductor layers. The stress gradient leads to a bending or a curvature of the contact spring which is connected to the substrate on one side. The semiconductor layers need not necessarily be directly connected to one another. Intermediate layers are equally possible, but they should only have an insignificant influence on the formation of the stress gradient in the semiconductor material. By way of example, a silicon nitride layer is suitable which is thin in comparison with the semiconductor layers. One of the two semiconductor layers, referred to below as first semiconductor layer, is located at the outside of the bend or curvature, while the other, referred to below as second semiconductor layer, faces the inside of the bend. Accordingly, the first semiconductor layer faces the substrate on which the contact spring is arranged.

The different strain of the first and second semiconductor layers may be brought about e.g. by different doping. It is thus possible, e.g. in the case of polysilicon as semiconductor material, to provide the first semiconductor layer with a lower doping than the second semiconductor layer in order to achieve the bending discussed. By way of example, phosphorus, arsenic and boron are suitable as dopant. The extent of the strain can be varied within wide ranges depending on the magnitude of the doping and the deposition temperature.

A further possibility for bringing about the different strain of the first and second semiconductor layers is depositing at different temperatures. Thus, e.g. in the case of polysilicon as semiconductor material, the first semiconductor layer may be deposited at a higher temperature than the second semiconductor layer in order to obtain the specified bend. The two semiconductor layers can be doped in this case. In order to reduce the electrical resistance and in order to improve the contact properties, at least the second semiconductor layer facing the substrate to be contact-connected should be adequately doped. In this case, the doping should preferably be sufficiently high in order that the electrical resistance of the contact spring is lower than the resistance of the substrate to be measured or of the doping region.

Further information on the setting of the strain in semiconductor layers is described in the specialist articles by M. Orpana et al., "Control of residual stress of polysilicon thin films by heavy doping in surface micromachining" IEEE 1991, pp. 957–960 and M. Biebl et al., "In situ phosphorus-doped polysilicon for integrated MEMs", Transducers '95—Eurosensors IX, $8^{th}$ International Conference on Solid-State Sensors and Actuators, Stockholm, Sweden, Jun. 25–29, 1995, pages 198–201, the disclosure content of which is hereby incorporated in its entirety.

The thickness and the length of the freely movable part of the contact spring further influence the spring properties, in particular the spring constant of the contact spring. With the length the same, the thickness of the contact spring determines in particular the restoring force, while an increasing length leads to the free end being bent out to a greater extent relative to the plane which runs through the fixed end of the contact spring and the substrate surface. Given a preferred length of the contact spring of between 100 and 1000 $\mu$m, the free end may be between 10 and 100 $\mu$m. If the contact spring is used for the contact connection of a semiconductor wafer, it is thus possible to compensate for height differences of a few 10 $\mu$m in conjunction with sufficiently reliable contact connection.

Preferably, at least one protective structure is provided at the substrate, which structure protects the at least one contact spring against an excessively high degree of bending if the contact spring configuration is pressed with the at least one contact spring against another substrate. An overstressing of the contact spring is intended to be avoided as a result. It is favorable if the protective structure runs annularly around the contact spring, the contact spring being fixed to a sidewall of the protective structure on one side. The protective structure, which simultaneously constitutes an impact protection, is preferably crater-shaped in cross section, the contact spring being connected to an inner wall of the crater on one side. The size of the protective structure expediently depends on the size of the contact spring and preferably lies between 100 and 500 $\mu$m. Moreover, it is favorable to produce the protective structure from the semiconductor material and to cover it with an insulating ring which leaves the contact spring free. As a result, on the one hand, the protective structure can produce an electrical connection to the contact spring. On the other hand, the protective structure is electrically insulated at its top side.

Preferably, the contact spring configuration has a plurality of contact springs which are pressed against the semiconductor wafer to be contact-connected during the contact connection of the semiconductor wafer.

The number of contact springs may be as much as a few tens of 1000s, depending on whether the intention is to produce an extensive contact with the semiconductor substrate via all the contact springs or a targeted contact connection of a few contact regions of the semiconductor wafer via individual contact springs arranged in a specific contact pattern. The contact springs are preferably doped in a manner dependent on the contact regions to be contact-connected, in order to avoid e.g. the formation of disturbing pn junctions. Moreover, the contact springs should have a sufficiently high doping in order to reduce their electrical resistance. In particular, the resistance of the contact spring should be lower than other series-connected resistances, in order that the total resistance is not dominated by the resistance of the contact spring.

In order to produce as homogeneous a contact as possible with the semiconductor wafer to be contact-connected, it is recommended that the contact springs be arranged as regularly as possible. By way of example, matrix- or grid-type configurations are highly suitable. On the other hand, if the intention is to contact-connect already patterned semiconductor wafers, i.e. semiconductor wafers with in some instances completed integrated circuits, contact spring configurations adapted to the pattern of the contact regions are preferable. A highly flexible way of obtaining the corresponding contact pattern in each case is opened up by an initially uniform grid-type production of contact springs with subsequent selective removal of those contact springs which are not required for the contact connection. Thus, blanks of contact spring configurations which all have a matrix-type configuration of the contact springs in each case can first be produced independently of the contact pattern respectively required. Only afterward is the pattern desired for the respective purpose of use written in. Cost-intensive photomasks specifically coordinated with the respective contact pattern can thus be dispensed with. The contact springs that are not required are preferably removed using a serial writing tool, e.g. through the use of a laser beam. As an alternative, it is possible for electrical connection tracks to individual contact springs to be selectively opened in a targeted manner. If appropriate, the individual contact springs can be doped differently.

The contact springs may all be at a common electrical potential. This is expedient particularly in the case of an extensive contact.

Furthermore, it is preferred if each contact spring is respectively assigned a switching element which connects the respective contact spring to a lead. The contact springs can thus be connected individually to electrical leads, thereby increasing the flexibility in the contact connection and evaluation of the semiconductor wafer to be contact-connected.

The switching elements are preferably field-effect transistors. The contact springs are connected to a respective doping region of their respectively assigned field-effect transistor. In the case of a grid-type configuration, the field-effect transistors can be driven column by column via selection lines in a manner comparable to a dynamic semiconductor memory (DRAM), in which case the respective doping regions of the field-effect transistors that are not connected to the contact spring can be connected row by row via a type of bit line. In this case, individual contact springs can be selected analogously to the selection of memory cells of a DRAM.

Furthermore, it is preferred if each contact spring is directly electrically conductively connected to a separate lead, e.g. in the form of a conductor track in each case. As a result, all of the contact springs can be addressed individually.

The protective structures can also be used for the contact connection of the contact springs, provided that they are composed of an electrically conductive material. This may be e.g. preferably likewise a semiconductor material. If the protective structures are composed of an electrically insulating material, the electrical connection to the contact springs can be produced via conductor tracks arranged at the protective structures.

The protective structures are at a distance of about 100 to 1000 $\mu$m from one another, particularly in the case of a grid-type configuration. It is favorable if the distances between the contact springs lie in the region of the layer thickness of the semiconductor wafer to be contact-connected. Furthermore, if an independent contact connection of the contact springs or of individual groups of contact springs is chosen, then inhomogeneities that possibly occur during the contact connection or locally different contact resistances can be compensated for by adaptation of the voltage or current individually applied to each contact spring. Furthermore, in the case of separate leads to the contact springs, it is possible to simultaneously produce e.g. up to a few tens of 1000s of contacts with the patterned semiconductor wafers, in order to be able to carry out measurements or examine electrical processes.

Relatively large height differences of directly adjacent contact regions can also be compensated for by the contact springs according to the invention. By contrast, this is not possible in the case of the configuration in accordance with U.S. Pat. No. 5,869,974, where only height differences which extend over a relatively large region can be compensated for. Moreover, on account of their high spring force, the contact springs according to the invention exhibit a relatively high tolerance to dust particles and the like which are situated on the surface of the contact regions of the semiconductor wafer to be contact-connected. Furthermore, the comparatively high adjustable spring force of the contact springs ensures a sufficiently good ohmic contact between the contact spring and the contact region of the semiconductor wafer to be contact-connected.

With the objects of the invention in view there is also provided, a method for producing a contact spring configuration, the method includes:

a) providing a semiconductor material on a substrate such that a stress gradient is produced within the semiconductor material;

b) producing at least one strip-shaped contact spring from the semiconductor material by patterning the semiconductor material; and c) detaching the contact spring at one side thereof from a surface of the substrate such that the contact spring is fixed to the surface of the substrate on another side thereof and such that the contact spring bends due to the stress gradient in the semiconductor material.

In other words, the invention furthermore relates to a method for producing a contact spring configuration with a substrate and at least one strip-type contact spring which is fixed to a surface of the substrate on one side and is composed of a semiconductor material, having the following steps:

a) the semiconductor material is applied to the substrate in such a way that a stress gradient is produced within the semiconductor material;

b) the semiconductor material is patterned, so that at least one strip-type contact spring is produced; and c) the contact spring is stripped away from the substrate surface at one side, so that the contact spring bends due to the stress gradient in the semiconductor material.

In this case, the stress gradient within the semiconductor material can be brought about e.g. in situ by changing deposition parameters.

In principle, the stress gradient can be established by changing a plurality of process parameters. The deposition temperature, the magnitude and type of the doping and the deposition rate are suitable, in particular. The doping can be effected in situ or subsequently by implantation. The stress gradient which forms during the deposition can be influenced by a subsequent thermal treatment (anneal).

It is furthermore preferred if in step a) at least a first and a second semiconductor layer (28, 32), forming the semiconductor material (30), are applied to the substrate (6), the first and second semiconductor layers (28, 32) having a different mechanical prestress which brings about the stress gradient in the semiconductor material (30); and in step b) the first and second semiconductor layers (28, 32) are patterned, so that at least one strip-type contact spring (2) is produced.

The first and second semiconductor layers are successively applied to the substrate and preferably patterned jointly, a preferably strip-type contact spring being produced. The latter still has a whole-area contact with the substrate, so that the stress gradient built up in the semiconductor material by the two differently strained semiconductor layers does not yet lead to a bending of the contact spring. The stress gradient should be chosen such that it does not become too great, in order to avoid an uncontrolled detachment of the contact spring. In addition, there would be the risk of weakening the one-sided fixing of the contact spring. Finally, the contact spring is detached from the substrate to the desired length at one side, thereby producing a cantilever. The detachment can be brought about e.g. by undercutting the substrate. In the detached part, the internal stress gradient now causes the contact spring to bend.

The first and second semiconductor layers can also be formed during a continuous deposition of the semiconductor material. In this case, the deposition parameters are altered in situ and lead to a deposited semiconductor layer between whose top side and underside a stress gradient is formed.

The semiconductor material or the semiconductor layers can initially be deposited in either amorphous or polycrystalline form. The crystallinity obtained depends in particular on the deposition temperature and the deposition rate. A subsequent thermal treatment then both influences the mechanical properties and sets them in a desired manner and converts the amorphous semiconductor material into a polycrystalline material. Accordingly, the contact spring should preferably be composed of polycrystalline material. In the case of the deposition of the two semiconductor layers, the thermal treatment can follow each deposition. Preferably, however, the thermal treatment should only be effected after the deposition of both semiconductor layers. A bipartite process implementation has the advantage that the mechanical properties can be individually adapted. In this case, however, it should be taken into account that the second thermal treatment likewise influences the first semiconductor layer. By contrast, the single-part process implementation is more advantageous from the standpoint of process economy.

It is preferred if before step a) an auxiliary layer is applied to the substrate surface and at least one opening extending as far as the substrate surface is etched into the auxiliary layer; in step a) the semiconductor material is applied into the at least one opening in the auxiliary layer and to the surface of the auxiliary layer; and in step c) the auxiliary layer is removed selectively with respect to the semiconductor material, the contact spring remaining fixed to the substrate by way of the semiconductor material introduced into the opening in the auxiliary layer.

In this case, the auxiliary layer has two functions, in particular. Firstly, it has the effect that the contact spring is produced at a predetermined distance from the substrate surface, in order that it can oscillate freely, if appropriate. Furthermore, the auxiliary layer simplifies the detachment of the contact spring, since this is done automatically when the auxiliary layer is removed. The contact spring remains connected to the surface of the substrate via the material introduced into the opening in the auxiliary layer; the material may be the semiconductor material but may also be any other material. The material should preferably exhibit front-end suitability.

Furthermore, it is preferred if the auxiliary layer includes two partial layers, and firstly a first of the two partial layers is applied and at least one window extending as far as the substrate surface is etched into the partial layer; edge webs are formed which are connected to the substrate surface at the sidewalls of the window; a second of the two partial layers, for completing the auxiliary layer, is applied over the whole area to the first partial layer and the edge webs; and the opening extending as far as the substrate surface is etched into both partial layers; and, in step c), in order to remove the auxiliary layer, the first and second partial layers are removed selectively with respect to the edge webs and with respect to the semiconductor material.

The edge webs are intended to prevent so-called sticking. During the removal of the auxiliary layer, which is done e.g. wet-chemically, it can happen, on account of the surface tension of the etching medium used, that the contact spring is sucked onto the substrate surface and remains stuck there. The edge webs prevent a whole-area bearing on the substrate surface and thus sticking.

Furthermore, it is preferred if the opening etched into the auxiliary layer is made, in a plan view of the substrate surface, in the form of a ring running around the contact spring, the contact spring running within the ring proceeding from a sidewall of the ring. As a result, a crater-shaped or annular protective structure is formed around the contact spring.

The method according to the invention is furthermore used for producing a contact spring configuration having a plurality of contact springs for the contact connection of a semiconductor wafer.

Another mode of the method according to the invention includes forming the first one and the second one of the partial layers from one of TEOS (Tetraethylorthosilicate) and BPSG (Boron-Doped Phosphosilicate Glass) and forming the edge webs from silicon nitride.

Yet another mode of the method according to the invention includes wet-chemically removing the first one and the second one of the partial layers by using HF.

A further mode of the method according to the invention includes removing the first one and the second one of the partial layers by using a combination of wet-chemical HF etching and subsequent critical point dry etching.

Another mode of the method according to the invention includes removing the first one and the second one of the partial layers by using HF gas.

Another mode of the method according to the invention includes etching, in step b), auxiliary openings extending as far as the auxiliary layer into the semiconductor material such that an etchant can penetrate through the auxiliary openings for removing the auxiliary layer.

A further mode of the method according to the invention includes etching the at least one opening into the auxiliary layer such that a ring extending around the contact spring is formed when viewed in a plan view of the surface of the substrate and such that the contact spring projects from a sidewall of the ring and extends within the ring.

Yet a further mode of the method according to the invention includes forming the first and second semiconductor layers of the semiconductor material from silicon by depositing one of polysilicon and amorphous silicon; and forming the first semiconductor layer prior to forming the second semiconductor layer and providing the first semiconductor layer with a dopant concentration lower than a dopant concentration of the second semiconductor layer.

Another mode of the method according to the invention includes depositing the first and second semiconductor layers from an $Si_2H_6/PH_3$ gas mixture at a temperature of substantially 650° C., the ratio of $Si_2H_6$ to $PH_3$ being set to substantially 50 in the case of the first semiconductor layer and to substantially 30 in the case of the second semiconductor layer.

Yet another mode of the method according to the invention includes performing a thermal treatment at substantially 900° C. for substantially 20 seconds after depositing the first and second semiconductor layers.

Another mode of the method according to the invention includes depositing the first and second semiconductor layers at a pressure of substantially 3330 Pa.

A further mode of the method according to the invention includes depositing the first and second semiconductor layers at a pressure of substantially 3330 Pa.

Another mode of the method according to the invention includes forming the first and second semiconductor layers of the semiconductor material from silicon by depositing one of polysilicon and amorphous silicon; and forming the first semiconductor layer at a first deposition temperature and subsequently forming the second semiconductor layer at a second deposition temperature lower than the first deposition temperature.

A further mode of the method according to the invention includes using substantially 610° C. as the first deposition temperature and using substantially 590° C. as the second deposition temperature.

Another mode of the method according to the invention includes providing the first and second semiconductor layers as polycrystalline layers by using at least one thermal treatment subsequent to depositing the first and second semiconductor layers.

Another mode of the method according to the invention includes producing a plurality of contact springs.

Another mode of the method according to the invention includes providing the plurality of contact springs as a matrix configuration and subsequently removing given ones of the contact springs which are not required for a contact connection of a semiconductor wafer.

A further mode of the method according to the invention includes removing the given ones of the contact springs serially.

Yet a further mode of the method according to the invention includes removing the given ones of the contact springs serially with a laser.

Another mode of the method according to the invention includes using a semiconductor substrate as the substrate and integrating a plurality of field-effect transistors in the semiconductor substrate; and connecting respective doping regions of the field-effect transistors to respective ones of the contact springs.

Other features which are considered as characteristic for the invention are set forth in the appended claims.

Although the invention is illustrated and described herein as embodied in a contact spring configuration for the contact connection of a semiconductor wafer and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic side view of a contact spring of a contact spring configuration according to the invention;

FIG. 2 is a diagrammatic cross-sectional view of a contact spring according to the invention;

FIGS. 3A–3B are diagrammatic plan views of a contact spring according to the invention;

FIGS. 6A–6C are diagrammatic sectional views for illustrating further method steps for producing a contact spring according to the invention;

DESCRIPTION OF THE PREFERRED EMBODIMENTS

Figure 4A:
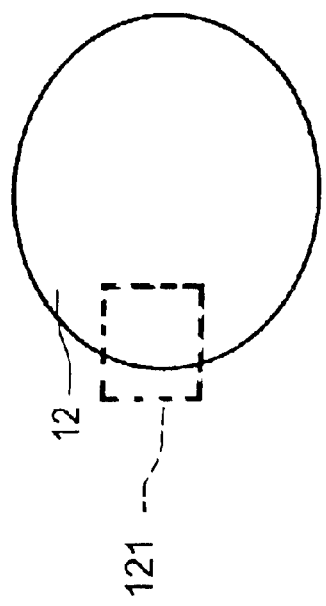
FIGS. 4A–4C are differently scaled diagrammatic plan views of details from a contact spring configuration having a plurality of contact springs arranged in grid form.

Referring now to the figures of the drawings in detail and first, particularly, to FIG. 1 thereof, there is shown a contact spring 2 surrounded by a protective structure 4. The latter is arranged on a substrate 6 and simultaneously produces the connection between the contact spring 2 and the substrate 6. The protective structure 4 may be composed of a semiconductor material (e.g. Si, GaAs), or alternatively from any other suitable material. The contact spring itself is composed of a semiconductor material (e.g. Si, GaAs) in which an intrinsic stress gradient leads to a bending of the free end 8 of the contact spring 2. As a result, the free end 8 projects from the upper plane of the protective structure.

FIG. 2 shows a cross section of the contact spring configuration according to the invention. The fixed end 10 of the contact spring is connected to an inner side of the protective structure.

For better illustration, a plan view of the contact spring configuration is illustrated in FIG. 3A and in FIG. 3B. Preferred geometrical dimensions of the contact spring and its protective structure are specified in FIGS. 1 to 3. However, the contact spring configuration according to the invention is not restricted to the specified dimensions and uses.

Figure 4B:
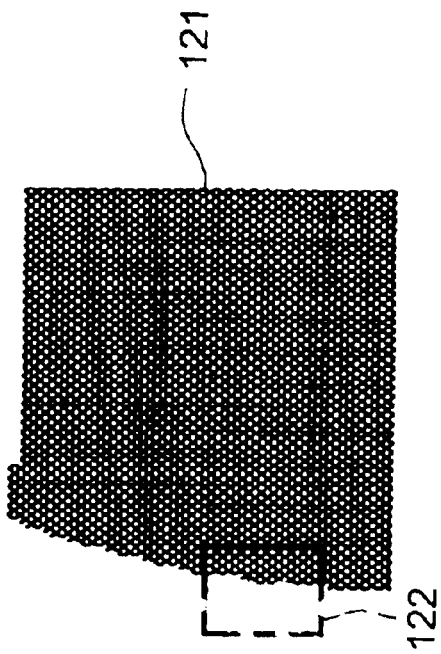
Figure 4C:
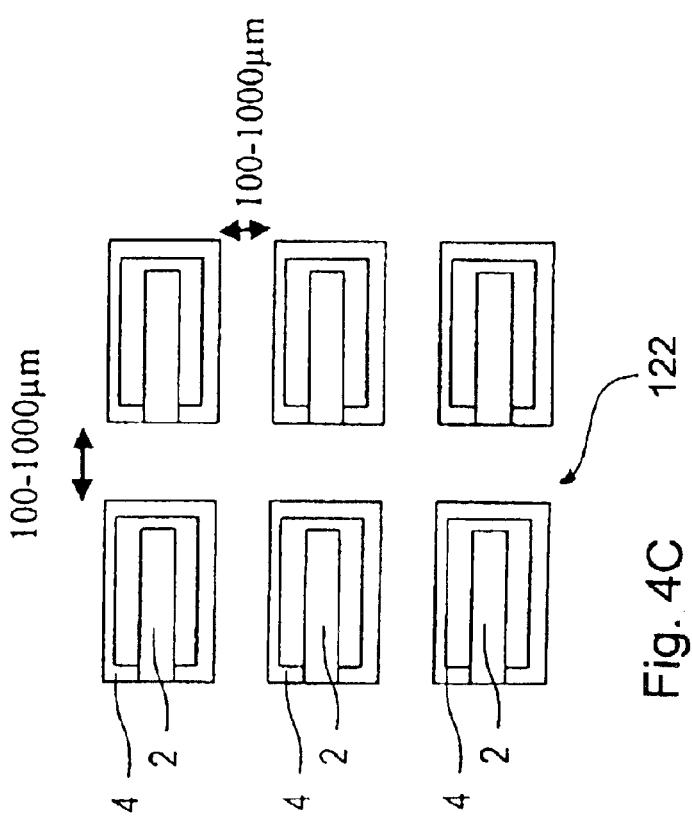

A contact spring configuration with a grid-type configuration of individual contact springs surrounded by a respective protective structure is illustrated in FIGS. 4A–4C. FIG. 4B shows the detail 121 indicated in FIG. 4A by a broken line. FIG. 4C shows the detail 122 indicated in FIG. 4B by a broken line.

A plurality of contact springs 2 is arranged in grid form on a wafer 12. The distance between the individual protective structures 4 surrounding the contact springs 2 lies between 100 and 1000 µm, thereby producing a distance between the individual contact springs which is correspondingly adapted to the thickness of the semiconductor wafer to be contact-connected. The distance between the individual contact springs 2 lies between 100 and 2000 µm, preferably between 200 and 1500 µm. Such a grid-type configuration is favorable in particular for a large-area electrical contact with the semiconductor wafer, which contact is produced via all the contact springs. The length of the contact spring is about 100 to 1000 μm.

Figure 5A:
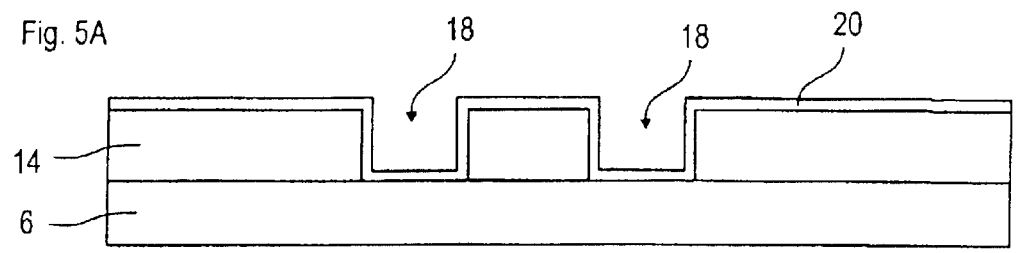
FIGS. 5A–5G are diagrammatic sectional views of individual method steps for producing a contact spring according to the invention.
Figure 5B:
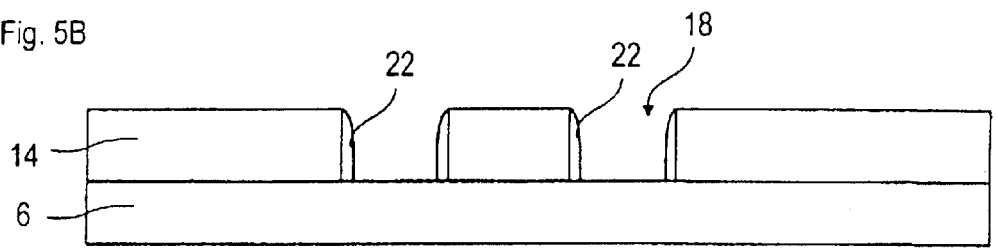
Figure 5C:
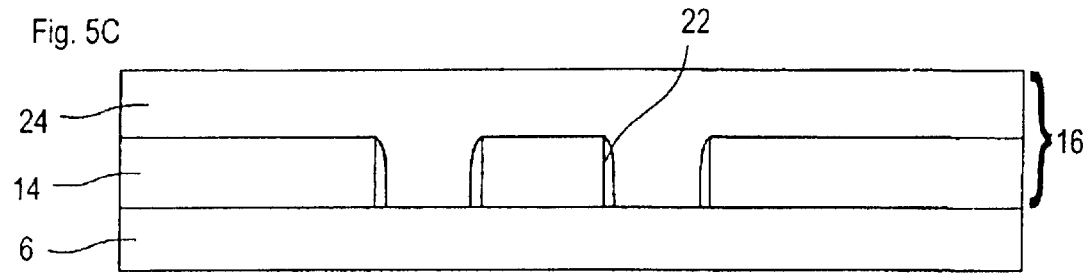
Figure 5D:
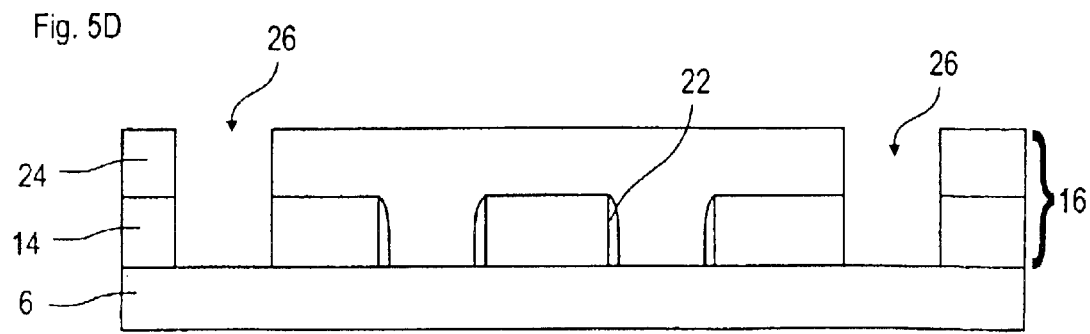
Figure 5E:
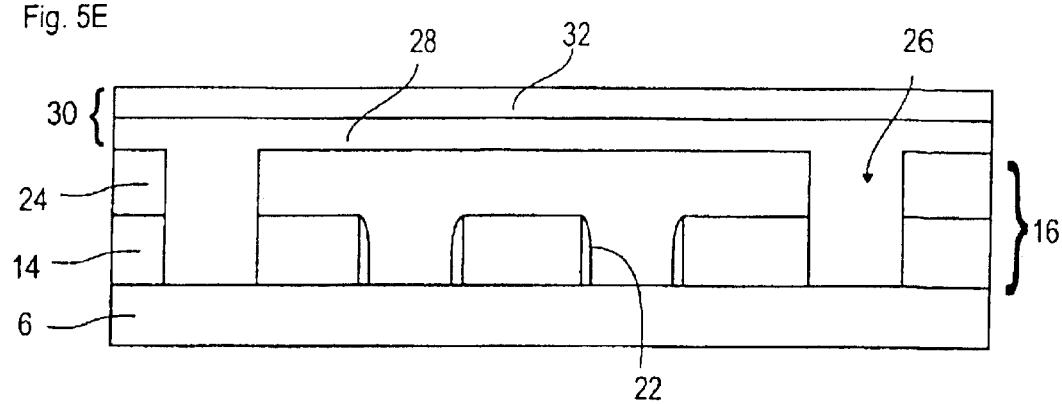
Figure 5F:
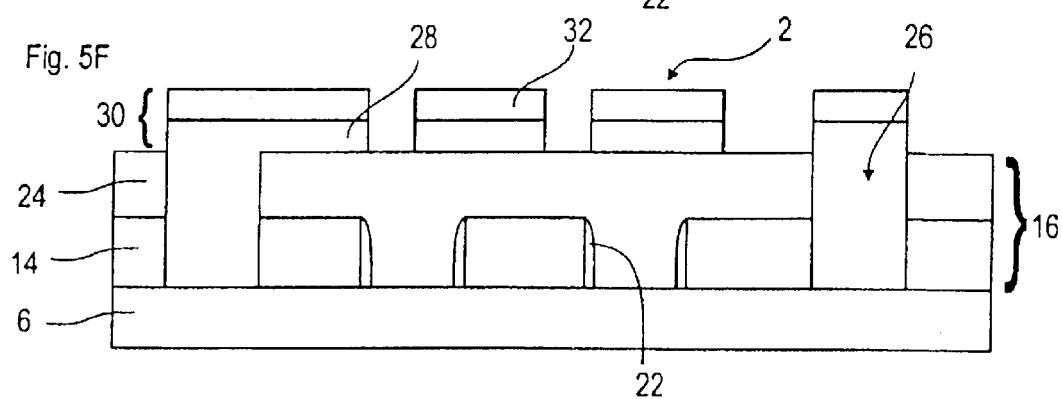

For better illustration of individual method steps during the production of the contact spring configuration or the contact springs, reference is made to FIGS. 5A to 5G. A first partial layer 14 of an auxiliary layer 16 is applied to the substrate 6 composed of silicon and a window 18 extending as far as the substrate 6 is etched into the layer. A sacrificial layer 20 preferably made of silicon nitride is subsequently applied conformally and subjected to isotropic dry etching, so that edge webs 22 remain at the sidewalls of the windows 18. In a later method step, the edge webs form spacers to prevent the sticking of the contact spring that is to be formed. The structure thus obtained, which is shown in FIG. 5B, subsequently has a second partial layer 24 applied to it in a planarizing manner. In this case, the windows 18 produced in the first partial layer 14 are completely filled. The first and second partial layers 14 and 24, which together form the auxiliary layer 16, are preferably composed of silicon oxide, in particular of TEOS or BPSG.

In a further method step, an opening 26 extending as far as the substrate surface is formed in the auxiliary layer 16. In this case, the opening 26 has the form of the protective structure that is to be formed around the contact spring. At the same time, the opening 26 defines the anchoring of the contact spring to the substrate 6.

Afterward, in-situ-doped polysilicon, which forms the first semiconductor layer 28 of the semiconductor material 30, is deposited into the opening 26 and onto the surface of the second auxiliary layer 24. The first semiconductor layer 28 is deposited e.g. at a temperature of about 650° C. and about 3330 Pa (25 torr) from an $Si_2H_6/PH_3$ mixture with a ratio of $Si_2H_6:PH_3$ of about 30. The flows of $Si_2H_6$ and $PH_3$ are set to about 150 and 35 sccm (standard cubic centimeters per minute). In the case of the subsequently deposited second semiconductor layer 32, by contrast, the ratio of $Si_2H_6:PH_3$ is set to about 50 with the conditions otherwise remaining the same. The interconnected first and second semiconductor layers together form the semiconductor material 30, in which an intrinsic stress gradient is produced on account of the different strain of the two semiconductor layers. The stress gradient tends to bend the contact spring that is to be formed away from the surface of the substrate 6. The in-situ doping with As leads to comparable results. If appropriate, the magnitude of the doping must be adapted. The mechanical strains of the two semiconductor layers are set by a final short-time thermal treatment (rapid thermal anneal, RTA) at about 900° C. for about 20 s. The first semiconductor layer then has a compressive stress of about −46 MPa, while the second semiconductor layer is subject to a tensile stress of about 107 MPa. These values are only by way of example and can be varied through the temperature and the duration of the thermal treatment. More detailed information in this regard can be found in the specialist article by T. Scheiter et al., "Rapid thermal annealing of doped silicon films to relax intrinsic stress", Sensor and Materials, Tokyo (1996), Vol. 8, No. 7, pp. 445–454,the disclosure content of which is hereby incorporated in its entirety.

An alternative possibility for bringing about the stress gradient is opened up during a deposition of the first and second semiconductor layers from a $PH_3/SiH_4$ mixture at different temperatures. A deposition temperature of about 610° C. is chosen in the case of the first semiconductor layer 28 and of about 590° C. in the case of the second semiconductor layer. In this case, the deposition temperature relates to the temperature of the substrate. A subsequent doping is likewise possible. During the deposition of the first semiconductor layer, the ratio of $PH_3$ to $SiH_4$ is set to about $1.6*10^{-3}$ and to about $1*10^{-2}$ in the case of the second semiconductor layer. After a final RTA step at 900° C. (about 20 s), the first semiconductor layer is subject to a compressive stress of approximately −180 MPa, whereas the second semiconductor layer is subject to a tensile stress of about 30 MPa.

A further possibility for producing the stress gradient in the case of boron-doped semiconductor layers is specified below. In this case, the semiconductor material is likewise applied in two layers. The first semiconductor layer is deposited at a temperature of about 625° C., and the second at a temperature of about 560° C. using silane. Boron is subsequently implanted up to a target concentration of about $4*10^{20}$/cm. Through the use of an RTA step (950° C., 20 s), the compressive stress within the first semiconductor layer is set to about −130 MPa and the tensile stress within the second semiconductor layer is set to about 250 MPa.

The two semiconductor layers 28 and 32 are subsequently patterned. The final form of the contact spring 2 is formed in this case. At the same time, auxiliary openings 34 in the form of etching holes or trenches are introduced into the contact spring 2 through the use of a dry etching, which are intended to enable a better access to the auxiliary layer 16 for the etching medium that is subsequently to be applied. The residual polysilicon together with the polysilicon situated in the opening 26 forms the protective structure 4.

Figure 5G:
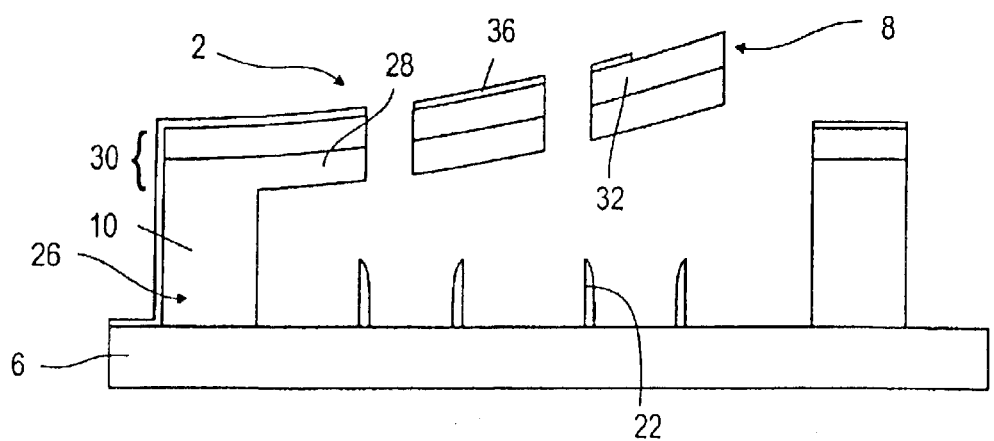

The auxiliary layer 16 is subsequently removed. To that end, the two partial layers 14 and 24 forming the auxiliary layer 16 are removed wet-chemically through the use of HF selectively with respect to the semiconductor material of the contact spring and with respect to the material of the edge webs 22. During the subsequent drying, the edge webs 22 prevent sticking of the contact spring. As an alternative, an etching using HF gas or wet-chemically using HF and subsequent critical point drying would be possible. As a result of the removal of the auxiliary layer 16, the contact spring is detached from the substrate except for the semiconductor material situated in the opening 26. The stress gradient built up in the semiconductor material now causes the free end 8 of the contact spring 2 to bend away from the substrate surface. The structure thus obtained is shown in FIG. 5G.

For the insulation of the contact spring 2, an insulation layer 36 may be applied and removed in the region of the free end 8. A thin silicon nitride layer is suitable for this, by way of example.

As an alternative, and one which is particularly favorable with regard to the etching and uncovering of the contact spring, there is an annular insulation structure (annular frame) 36 on the protective structure. A suitable material is e.g. silicon nitride. The individual steps for producing this frame 36 are illustrated in FIGS. 6A–6C. The silicon nitride layer 36 is applied to the second semiconductor layer 32 and preferably patterned jointly with the contact spring. Afterward, the contact spring is freed of the silicon nitride layer 36, so that the latter only remains as a frame on the protective structure. Consequently, the mechanical properties of the contact spring are not influenced by the silicon nitride layer 36. At the same time, the latter can be made thicker in order to improve the insulation.

The individual contact springs can be doped differently depending on the doping of the contact regions of the semiconductor wafer which are to be contact-connected, in order to produce the best possible ohmic contact.

Figure 7:
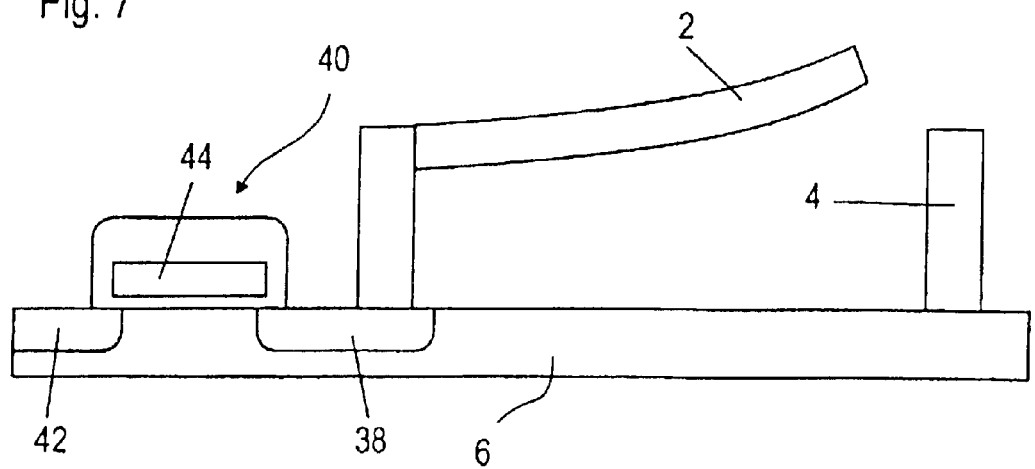
FIG. 7 is a diagrammatic sectional view of a contact spring connected to a field-effect transistor.

FIG. 7 shows a contact spring 2 which is connected to a doping region 38 of a field-effect transistor 40 via the protective structure 4 composed of an electrically conductive material. In this embodiment, the field-effect transistor 40 performs the function of a switching element for selectively connecting the contact spring to a lead (not illustrated here) which is connected to the other doping region 42 of the field-effect transistor 40. The field-effect transistor 40 is driven via the selection line 44. A plurality of field-effect transistors and contact springs is preferably arranged in matrix form.

If the protective structure is composed of an electrically insulating material, the connection between the doping region 38 and the contact spring 2 is produced via conductor tracks (not illustrated here).

Figure 8A:
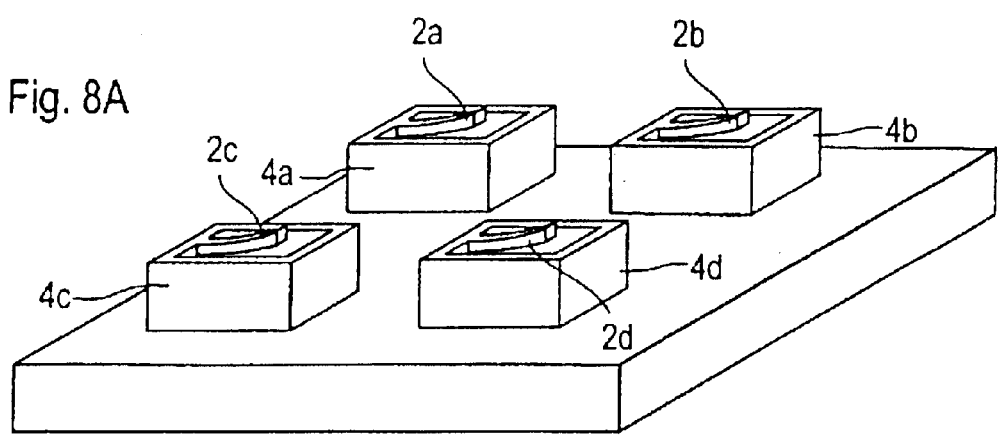
FIGS. 8A–8B are diagrammatic perspective views for illustrating individual method steps in the production of a contact pattern of a contact spring configuration according to the invention.
Figure 8B:
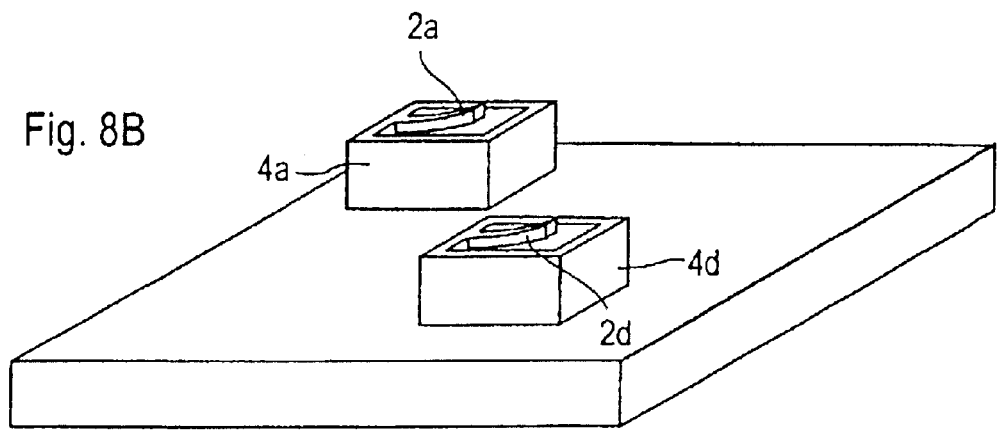

FIGS. 8A and 8B illustrate method steps for producing a contact spring configuration having a plurality of contact springs 2a–2d, which are initially arranged in grid form and, in this exemplary embodiment, are in each case surrounded by a protective structure 4a–4d. The contact springs and the protective structures are firstly produced all together, independently of the contact pattern sought. This simplifies the production process. In a subsequent method step, those contact springs 2b and 2c and also the protective structures 4b and 4c which are not necessary for the contact connection sought are selectively removed. This produces a contact-connection pattern oriented to the respective purpose of application. The unrequired contact springs and protective structures are preferably removed through the use of a laser beam which, depending on the wavelength used, effects cold ablation or thermal vaporization of the structures to be removed. The structure thus obtained is illustrated in FIG. 7B.

We claim:

1. A contact spring configuration, comprising:
   a substrate having a surface; and
   a strip-shaped contact spring having an end region fixed at said surface of said substrate for contact connection of a semiconductor wafer, said strip-shaped contact spring including a semiconductor material having a stress gradient causing an elastic bending of said strip-shaped contact spring.

2. The contact spring configuration according to claim 1, wherein:
   said semiconductor material includes semiconductor layers connected to one another;
   said semiconductor layers have respective strains different from one another and bring about said stress gradient of said semiconductor material such that said semiconductor material has a bend with an outer side and an inner side; and
   said semiconductor layers include a first semiconductor layer and a second semiconductor layer, said first semiconductor layer faces said outer side of said bend, said second semiconductor layer faces said inner side of said bend.

3. The contact spring configuration according to claim 2, wherein said semiconductor layers have respective dopings different from one another.

4. The contact spring configuration according to claim 3, wherein:
   said semiconductor layers are composed of polysilicon; and
   said first semiconductor layer has a first dopant concentration, said second semiconductor layer has a second dopant concentration, said first dopant concentration is lower than said second dopant concentration.

5. The contact spring configuration according to claim 4, wherein said first and second semiconductor layers are doped with a dopant selected from the group consisting of phosphorus, boron and arsenic.

6. The contact spring configuration according to claim 2, wherein said first and second semiconductor layers are deposition layers with respective different strains caused by respectively different deposition temperatures during deposition of said first and second semiconductor layers.

7. The contact spring configuration according to claim 6, wherein said first semiconductor layer has a first deposition temperature, said second semiconductor layer has a second deposition temperature, said first deposition temperature is higher than said second deposition temperature.

8. The contact spring configuration according to claim 1, wherein said contact spring is configured to contact a semiconductor wafer.

9. The contact spring configuration according to claim 1, including a protective structure disposed at said substrate, said protective structure protecting said contact spring against a given degree of bending when said contact spring is pressed against a semiconductor wafer to be contacted.

10. The contact spring configuration according to claim 9, wherein:
    said protective structure extends annularly around said contact spring; and
    said protective structure has a side wall, said end region of said contact spring is fixed to said sidewall of said protective structure.

11. The contact spring configuration according to claim 10, wherein said protective structure has a diameter of 100–1000 $\mu$m and a height of 100–500 $\mu$m.

12. The contact spring configuration according to claim 1, wherein said contact spring has a length of 100–1000 $\mu$m.

13. The contact spring configuration according to claim 1, wherein said contact spring has a free end, said free end of said contact spring projects 10–100 $\mu$m out of a plane extending through said end region and parallel to said surface of said substrate.

14. The contact spring configuration according to claim 1, including further contact springs, said contact spring and said further contact springs being configured to be pressed against a semiconductor wafer when contacting the semiconductor wafer.

15. The contact spring configuration according to claim 14, wherein said contact spring and said further contact springs are disposed as a grid configuration.

16. The contact spring configuration according to claim 14, including protective structures disposed at said substrate, said protective structures protecting said contact springs against a given degree of bending when said contact springs are pressed against the semiconductor wafer to be contacted, said protective structures being disposed at a distance of 100–1000 $\mu$m from one another.

17. The contact spring configuration according to claim 14, wherein said contact spring and said further contact springs are electrically conductively connected to one another.

18. The contact spring configuration according to claim 14, including switching elements and leads, each of said switching elements being assigned to a respective one of said contact springs for connecting a respective one of said contact springs to a respective one of said leads.

19. The contact spring configuration according to claim 18, wherein:
    said switching elements are field-effect transistors having respective doping regions;

said contact springs and said field-effect transistors are disposed as a matrix configuration; and said doping regions of said field-effect transistors are connected to respective ones of said contact springs.

20. The contact spring configuration according to claim 14, including leads, said contact springs being directly electrically conductively connected to respective ones of said leads.

21. The contact spring configuration according to claim 14, including:

protective structures disposed at said substrate, said protective structures protecting said contact springs against a given degree of bending when said contact springs are pressed against a semiconductor wafer to be contacted, said protective structures being composed of an electrically insulating material; and conductor tracks disposed at said protective structures, said contact springs being contacted via said conductor tracks.

22. The contact spring configuration according to claim 14, including protective structures disposed at said substrate, said protective structures protecting said contact springs against a given degree of bending when said contact springs are pressed against the semiconductor wafer to be contacted, said protective structures being composed of an electrically conductive material.

23. A method for producing a contact spring configuration, the method which comprises:

a) providing a semiconductor material on a substrate such that a stress gradient is produced within the semiconductor material;

b) producing at least one strip-shaped contact spring from the semiconductor material by pattering the semiconductor material; and c) detaching the contact spring at one side thereof from a surface of the substrate such that the contact spring has an end region fixed to the surface of the substrate on another side thereof for contact connection of a semiconductor wafer and such that the contact spring bends elastically due to the stress gradient in the semiconductor material.

24. The method according to claim 23, which comprises producing the stress gradient within the semiconductor material in situ by changing deposition parameters.

25. The method according to claim 23, which comprises:

performing step a) by forming at least a first and a second semiconductor layer on the substrate for forming the semiconductor material, the first and second semiconductor layers having a respective different mechanical prestress causing the stress gradient in the semiconductor material; and performing step b) by patterning the first and second semiconductor layers such that the at least one strip-shaped contact spring is produced.

26. The method according to claim 23, which comprises;

providing an auxiliary layer on the surface of the substrate and etching at least one opening extending as far as the surface of the substrate into the auxiliary layer prior to performing step a);

depositing, in step a), the semiconductor material into the at least one opening in the auxiliary layer and on the surface of the auxiliary layer; and removing, in step c), the auxiliary layer selectively with respect to the semiconductor material such that the contact spring remains fixed to the substrate via the semiconductor material introduced into the opening in the auxiliary layer.

27. The method according to claim 26, which comprises:

forming the auxiliary layer from two partial layers by firstly applying a first one of the two partial layers and etching at least one window extending as far as the surface of the substrate into the first one of the two partial layers;

forming edge webs connected to the surface of the substrate at sidewalls of the window;

applying a second one of the two partial layers substantially entirely over the first one of the two partial layers and the edge webs in order to complete the auxiliary layer;

etching the opening extending as far as the surace of the substrate into the two partial layers; and removing, in step c), the first oneand the second one of the two partial layers selectively with respect to the edge webs and with respect to the semiconductor material in order to remove the auxiliary layer.

28. The method according to claim 27, which comprises forming the first one and the second one of the partial layers from one of TEOS and BPSG and forming the edge webs from silicon nitride.

29. The method according to claim 27, which comprises wet-chemically removing the first one and the second one of the partial layers by using HF.

30. The method according to claim 27, which comprises removing the first one and the second one of the partial layers by using a combination of wet-chemical HF etching and subsequent critical point dry etching.

31. The method according to claim 27, which comprises removing the first one and the second one of the partial layers by using HF gas.

32. The method according to claim 27, which comprises etching, in step b), auxiliary openings extending as far as the auxiliary layer into the semiconductor material such that an etchant can penetrate through the auxiliary openings for removing the auxiliary layer.

33. The method according to claim 27, which comprises etching the at least one opening into the auxiliary layer such that a ring extending around the contact spring is formed when viewed in a plan view of the surface of the substrate and such that the contact spring projects from a sidewall of the ring and extends within the ring.

34. The method according to claim 25, which comprises:

forming the first and second semiconductor layers of the semiconductor material from silicon by depositing one of polysilicon and amorphous silicon; and forming the first semiconductor layer prior to forming the second semiconductor layer and providing the first semiconductor layer with a dopant concentration lower than a dopant concentration of the second semiconductor layer.

35. The method according to claim 34, which comprises depositing the first and second semiconductor layers from an $Si_2H_6/PH_3$ gas mixture at a temperature of substantially 650° C., the ratio of $Si_2H_6$ to $PH_3$ being set to substantially 50 in the case of the first semiconductor layer and to substantially 30 in the case of the second semiconductor layer.

36. The method according to claim 35, which comprises performing a thermal treatment at substantially 900° C. for substantially 20 seconds after depositing the first and second semiconductor layers.

37. The method according to claim 35, which comprises depositing the first and second semiconductor layers at a pressure of substantially 3330 Pa.

38. The method according to claim 36, which comprises depositing the first and second semiconductor layers at a pressure of substantially 3330 Pa.

39. The method according to claim 25, which comprises:
   forming the first and second semiconductor layers of the semiconductor material from silicon by depositing one of polysilicon and amorphous silicon; and
   forming the first semiconductor layer prior to forming the second semiconductor layer and providing the first semiconductor layer with a dopant concentration lower than a dopant concentration of the second semiconductor layer.

40. The method according to claim 39, which comprises using substantially 610° C. as the first deposition temperature and using substantially 590° C. as the second deposition temperature.

41. The method according to claim 25, which comprises providing the first and second semiconductor layers as polycrystalline layers by using at least one thermal treatment subsequent to depositing the first and second semiconductor layers.

42. The method according to claim 41, which comprises producing a plurality of contact springs.

43. The method according to claim 42, which comprises providing the plurality of contact springs as a matrix configuration and subsequently removing given ones of the contact springs which are not required for a contact connection of a semiconductor wafer.

44. The method according to claim 43, which comprises removing the given ones of the contact springs serially.

45. The method according to claim 43, which comprises removing the given ones of the contact springs serially with a laser.

46. The method according to claim 42, which comprises:
   using a semiconductor substrate as the substrate and integrating a plurality of field-effect transistors in the semiconductor substrate; and
   connecting respective doping regions of the field-effect transistors to respective ones of the contact springs.

* * * * *